United States Patent
Sugiyama et al.

(10) Patent No.: US 10,627,457 B2
(45) Date of Patent: Apr. 21, 2020

(54) MAGNETIC FIELD DETECTION SENSOR EXHIBITING A MONOTONOUS DECREASE IN IMPEDANCE FROM ZERO MAGNETIC FIELD

(71) Applicant: YAZAKI CORPORATION, Tokyo (JP)

(72) Inventors: Hiroki Sugiyama, Shizuoka (JP); Junya Tanigawa, Shizuoka (JP); Makoto Ishii, Shizuoka (JP); Takahiro Shouda, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/357,549

(22) Filed: Nov. 21, 2016

(65) Prior Publication Data

US 2017/0153300 A1    Jun. 1, 2017

(30) Foreign Application Priority Data

Nov. 26, 2015 (JP) ................. 2015-230417

(51) Int. Cl.
*G01R 33/06* (2006.01)

(52) U.S. Cl.
CPC ................. *G01R 33/063* (2013.01)

(58) Field of Classification Search
CPC .................................................. G01R 33/063
USPC ........................................................ 324/249
See application file for complete search history.

(56) References Cited

U.S. PATENT DOCUMENTS

| 5,889,403 A * | 3/1999 | Kawase ................. G01R 33/02 324/249 |
| 6,121,770 A * | 9/2000 | Sudo ...................... G01R 33/02 324/244 |
| 6,229,307 B1 * | 5/2001 | Umehara ............... G01R 33/02 324/244 |

(Continued)

FOREIGN PATENT DOCUMENTS

| JP | 6-347489 A | 12/1994 |
| JP | 8-75835 A | 3/1996 |

(Continued)

OTHER PUBLICATIONS

Japanese Office Action for the related Japanese Patent Application No. 2015-230417 dated Jan. 9, 2018.

*Primary Examiner* — Jay Patidar
(74) *Attorney, Agent, or Firm* — Kenealy Vaidya LLP

(57) ABSTRACT

A magnetic field detection sensor includes a magneto-impedance element and detects an external magnetic field from an output obtained by applying alternating current to the magneto-impedance element using a magneto-impedance effect. The magneto-impedance element includes a non-magnetic board and a magnetic film formed on a surface of the non-magnetic board, a longitudinal direction of the magnetic film is set as a detection direction of the external magnetic field, and magnetic anisotropy is provided such that a magnetization easy axis of the magnetic film is the same as the detection direction of the external magnetic field. The magnetic field detection sensor further includes a magnetic field generating portion which generates a magnetic field in a thickness direction of the magnetic film.

8 Claims, 2 Drawing Sheets

(56) References Cited

U.S. PATENT DOCUMENTS

| | | | |
|---|---|---|---|
| 6,239,594 B1 * | 5/2001 | Naito | G01R 33/02 324/249 |
| 6,351,119 B1 * | 2/2002 | Kawase | G01R 33/02 324/249 |
| 6,456,068 B1 | 9/2002 | Kawase | |
| 6,466,012 B1 * | 10/2002 | Mouri | G01R 33/02 324/249 |
| 7,772,841 B2 * | 8/2010 | Itoi | G01R 33/0011 324/244 |
| 9,063,185 B2 * | 6/2015 | Hebiguchi | G01R 15/205 |
| 2003/0052671 A1 * | 3/2003 | Kawase | G01C 17/30 324/249 |
| 2004/0207398 A1 * | 10/2004 | Kudo | G01R 33/02 324/249 |
| 2008/0238417 A1 * | 10/2008 | Suzuki | G01R 33/12 324/228 |
| 2010/0045285 A1 | 2/2010 | Ohmori et al. | |
| 2012/0326716 A1 * | 12/2012 | Kawase | G01R 15/148 324/263 |
| 2013/0141089 A1 | 6/2013 | Dyer et al. | |
| 2013/0307534 A1 * | 11/2013 | Hebiguchi | G01R 15/205 324/252 |
| 2015/0022199 A1 * | 1/2015 | Mito | G01R 15/207 324/252 |
| 2015/0234017 A1 | 8/2015 | Yamamoto et al. | |
| 2016/0245879 A1 * | 8/2016 | Tanigawa | G01R 33/0041 |

FOREIGN PATENT DOCUMENTS

| | | | |
|---|---|---|---|
| JP | 2001-116814 A | | 4/2001 |
| JP | 2002-55148 A | | 2/2002 |
| JP | 2002-94140 A | | 3/2002 |
| JP | 2003-35757 A | | 2/2003 |
| JP | 2004-45332 A | | 2/2004 |
| JP | 2005-345267 A | | 12/2005 |
| JP | 2006-184201 A | | 7/2006 |
| JP | 2008-197089 A | | 8/2008 |
| JP | 2015-92144 A | | 5/2015 |
| KR | 2006061786 A | * | 6/2006 |

* cited by examiner

IMPEDANCE CHARACTERISTIC

MAGNETIC FIELD DETECTION SENSOR EXHIBITING A MONOTONOUS DECREASE IN IMPEDANCE FROM ZERO MAGNETIC FIELD

CROSS-REFERENCE TO RELATED APPLICATION(S)

This application is based on and claims priority from Japanese Patent Application (Application No. 2015-230417) filed on Nov. 26, 2015, the entire contents of which are incorporated herein by reference.

BACKGROUND

1. Field of the Invention

The present invention relates to a magnetic field detection sensor.

2. Description of Related Art

Conventionally, for example, a magnetic field detection sensor has been proposed that is provided with an MI (magneto-impedance) element using an magneto-impedance effect. This magnetic field detection sensor may be applied, for example, as a current sensor that is disposed adjacent to an electric wire or the like where current to be measured flows and measures the current value by detecting the magnetic field generated by the current flowing on the electric wire or the like.

Moreover, as such a magnetic field detection sensor, a sensor has been proposed where the MI element is made so that the impedance characteristic is such as to monotonously decrease with the zero magnetic field as the peak. This magnetic field detection sensor has an advantage such that the detection range can be made large since the slope has a predetermined inclination over the entire area compared with a sensor provided with an MI element having an M-type impedance characteristic (for example, see JP-A-2001-116814, JP-B-4016750, and JP-A-2015-92144).

SUMMARY

However, it is not easy to make an MI element so that the impedance characteristic is such as to monotonously decrease with the zero magnetic field as the peak as described in JP-A-2001-116814, JP-B-4016750, and JP-A-2015-92144, and there are cases where the impedance characteristic is disordered in the vicinity of the peak of the zero magnetic field and the above-mentioned predetermined inclination cannot be obtained. In such cases, it is necessary to operate the MI element in such a manner as to avoid the vicinity of the zero magnetic field and this decreases the detection range, and the vicinity of the peak where the inclination should be large cannot be used and decrease in sensitivity is also brought about.

The present invention is made in order to solve such a problem, and an object thereof is to provide a magnetic field detection sensor capable of securing an impedance characteristic with a predetermined inclination in the vicinity of the peak in a case where the magnetic field detection sensor includes a magnetic impedance element having the impedance characteristic which monotonously decreases with the zero magnetic field as the peak.

In a first aspect of the invention, there is provided a magnetic field detection sensor which includes a magneto-impedance element and which detects an external magnetic field from an output obtained by applying alternating current to the magneto-impedance element using a magneto-impedance effect, wherein the magneto-impedance element includes a non-magnetic board and a magnetic film formed on a surface of the non-magnetic board, a longitudinal direction of the magnetic film is set as a detection direction of the external magnetic field, and magnetic anisotropy is provided such that a magnetization easy axis of the magnetic film is the same as the detection direction of the external magnetic field, and wherein the magnetic field detection sensor further includes a magnetic field generating portion which generates a magnetic field in a thickness direction of the magnetic film.

According to the magnetic field detection sensor of the first aspect, the magnetic impedance element includes the non-magnetic board and the magnetic thin film formed on the surface of the non-magnetic board, the longitudinal direction of the magnetic thin film is set as the detection direction of the external magnetic field, and magnetic anisotropy is provided such that the magnetization easy axis of the magnetic thin film is the same as the detection direction of the external magnetic field. For this reason, the magnetic impedance element is made to have the impedance characteristic which monotonously decreases with the zero magnetic field as the peak. Here, the inventors of the present application have found that by generating a magnetic field in the thickness direction of the magnetic thin film of the magnetic impedance element, even if the impedance characteristic is disordered in the vicinity of the peak of the zero magnetic field, this disorder can be improved. For this reason, by providing the magnetic field generating portion, an impedance characteristic with a predetermined inclination can be secured in the vicinity of the peak in a case where the magnetic field detection sensor includes the magnetic impedance element having the impedance characteristic which monotonously decreases with the zero magnetic field as the peak,.

In a second aspect of the invention, there is provided the magnetic field detection sensor according to the first aspect, further including: a bus bar including a metal plate member where current flows on a plane orthogonal to the thickness direction of the magnetic film in a direction orthogonal to the detection direction of the external magnetic field, wherein the magneto-impedance element is attached to one surface of the bus bar, and wherein the magnetic field generating portion includes a magnet and is attached to the other surface of the bus bar.

According to the magnetic field detection sensor of the second aspect, since the magnetic impedance element is attached to one surface of the bus bar and the magnet is attached to the other surface of the bus bar, the positional relationship therebetween is made fixed by the bus bar, whereby it is possible to prevent a situation that a magnetic field can not be generated in the thickness direction of the magnetic thin film because of breakage of the positional relationship therebetween due to vibrations or the like.

According to aspects of the present invention, it is possible to provide a magnetic field detection sensor capable of securing an impedance characteristic with a predetermined inclination in the vicinity of the peak in a case where the magnetic field detection sensor includes a magnetic impedance element having the impedance characteristic which monotonously decreases with the zero magnetic field as the peak.

DETAILED DESCRIPTION

Hereinafter, the present invention will be described in line with a preferred embodiment. The present invention is not limited to the embodiment shown below and may be modified as appropriate without departing from the gist of the invention. Moreover, while there are parts where illustrations and descriptions of some components are omitted in the embodiment shown below, it is to be noted that regarding details of the omitted technology, a publicly known or well-known technology is applied as appropriate within the bounds of not being inconsistent with the contents described below.

Figure 1:
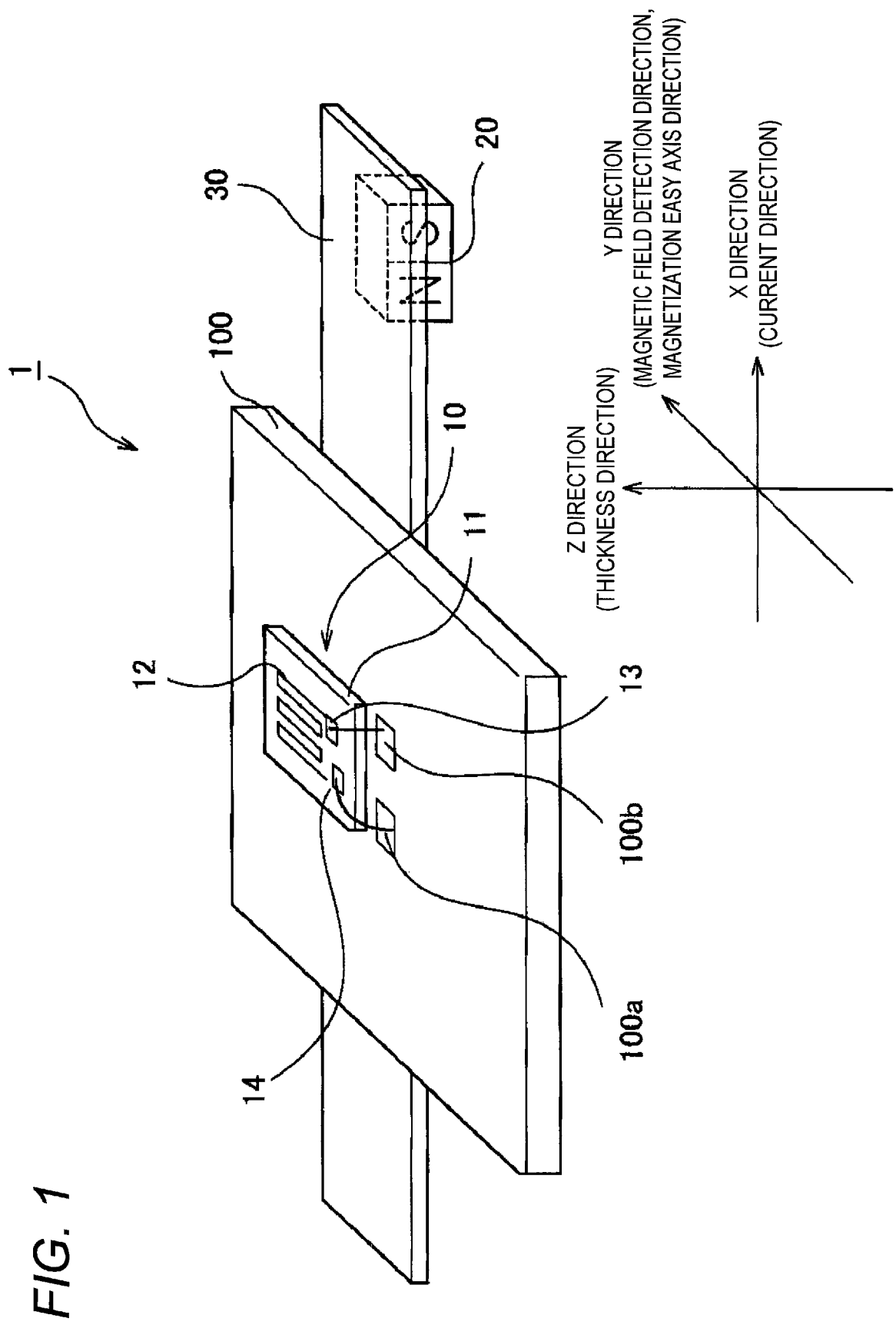
FIG. 1 is a structural view of a magnetic field detection sensor according to the present embodiment.

FIG. 1 is a structural view of a magnetic field detection sensor according to the present embodiment. While an example in which the magnetic field detection sensor is used as an element of a current sensor is described in the example shown in FIG. 1, the magnetic field detection sensor is not necessarily used as an element of the current sensor but may be used as an element of a direction sensor, a torque sensor and a rotation angle sensor.

As shown in FIG. 1, the magnetic field detection sensor 1 according to the present embodiment is formed of a magnetic impedance element 10, a magnet (magnetic field generating means) 20 and a bus bar 30. The magnetic impedance element 10 has a magneto-impedance effect, and is provided with a magnetic thin film (magnetic film) 12. Moreover, the magneto-impedance effect is a phenomenon in which, for example, when a high-frequency current is passed, the impedance is changed by a change of the skin depth due to a significant change of the permeability in the circumferential direction by the application of an external magnetic field.

This magnetic impedance element 10 is provided with a non-magnetic board 11 and electrodes 13 and 14 in addition to the above-mentioned magnetic thin film 12.

The non-magnetic board 11 is a board made of a non-magnetic material, and is mounted on a printed circuit board 100. This non-magnetic board 11 is made of calcium titanate, oxide glass, titania, alumina or the like, and is substantially in the shape of a rectangular parallelepiped in the present embodiment.

The magnetic thin film 12 is formed of a high-permeability metal magnetic film, and as shown in FIG. 1, is formed in the shape of a meander (the shape of a zigzag) in planar view on, of the surface of the non-magnetic board 11, the surface opposite to the surface where the printed circuit board 100 is provided.

Moreover, the magnetic thin film 12 is provided with magnetic anisotropy so that the direction of the magnetization easy axis thereof is the same as the longitudinal direction of the magnetic thin film 12 (the rising and falling direction of, when the meander shape is viewed as a rectangular wave, the rectangular wave) within the film surface. Moreover, this direction is the same as the detection direction of the external magnetic field. Hereinafter, this direction will be referred to as Y direction.

The shape of the magnetic thin film 12 is not limited to the meander shape and may be a linear shape or may be a different shape as long as it can realize an inverted V-shaped impedance characteristic.

The electrodes 13 and 14 are provided on the surface of the non-magnetic board 11 and at both ends of the magnetic thin film 12, and are connected to electrodes 100a and 100b on the printed circuit board 100 by a bonding wire. One of the electrodes 100a and 100b on the printed circuit board 100 is connected to an oscillation circuit or the like, and alternating current is applied thereto.

The magnetic impedance element 10 may have a structure in which a notch or the like is provided on the printed circuit board 100 and a bias coil is wound therearound together with the printed circuit board 100. Further, the magnetic thin film 12 may be formed on the reverse surface of the non-magnetic board 11, that is, the surface on the side where the printed circuit board 100 is provided. In this case, the electrodes 13 and 14 are provided on the reverse surface of the non-magnetic board 11 and at both ends of the magnetic thin film 12. Moreover, the electrodes 100a and 100b on the printed circuit board 100 are also provided on the reverse surface side of the non-magnetic board 11.

The magnet 20 generates a magnetic field, and in the present embodiment, is disposed with its position and orientation being determined so that the magnetic field is generated in the thickness direction of the magnetic thin film 12 (The thickness direction is not a direction with distinction between positive and negative. Hereinafter, the thickness direction will be referred to as Z direction.).

The bus bar 30 is a metal plate member where current flows in the X direction shown in FIG. 1 (a direction on a plane orthogonal to the thickness direction of the magnetic thin film 12 and a direction orthogonal to the detection direction of the external magnetic field). The magnetic impedance element 10 detects the magnetic field that changes by current flowing through this bus bar 30.

Here, the magnetic impedance element 10 is attached to one surface of the bus bar 30 through the printed circuit board 100. Further, the magnet 20 is attached to the other surface of the bus bar 30. The magnet 20 may be attached to the other surface of the bus bar 30 through a different member.

More specifically, the magnet 20 is provided on the other surface of the bus bar 30 a predetermined distance away from the magnetic impedance element 10 in the Y direction, and the direction connecting the magnetic poles is the Y direction. The magnet 20 may be provided on the reverse surface side of the magnetic impedance element 10 so that the direction connecting the magnetic poles is the Z direction or a different attachment method may be adopted.

Figure 2:
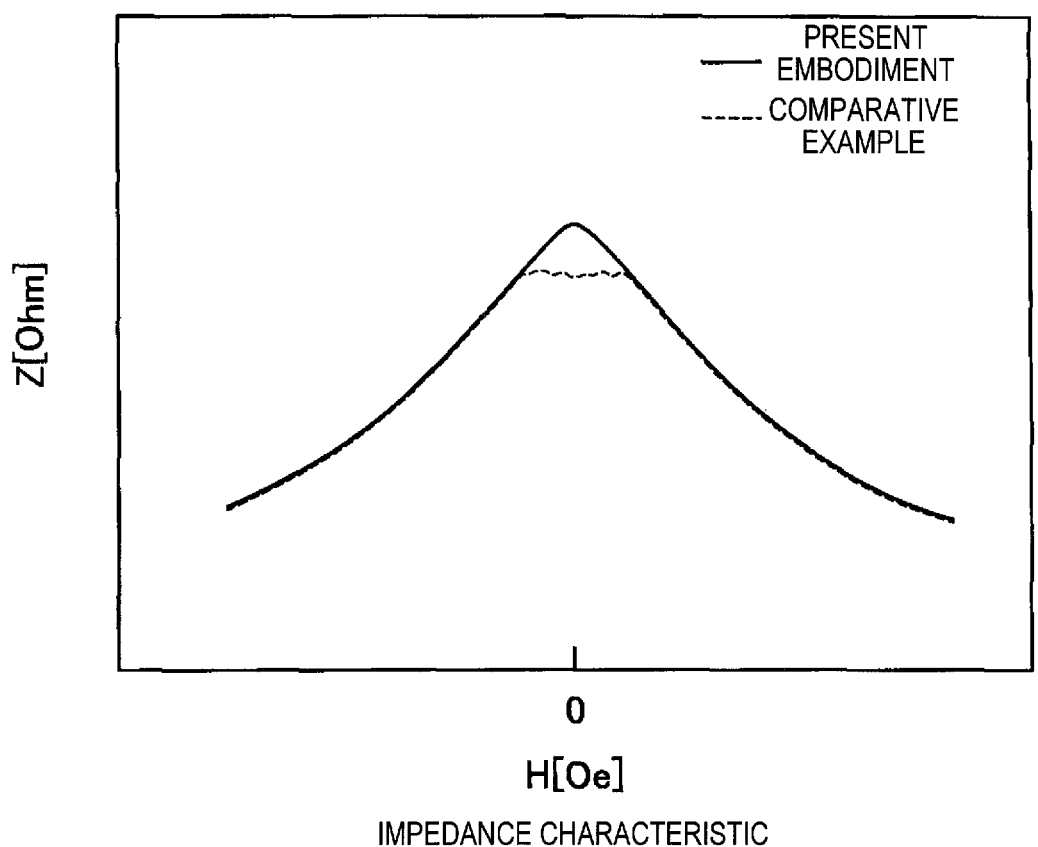
FIG. 2 is a view showing impedance characteristics of the magnetic field detection sensor according to the present embodiment and a magnetic field detection sensor according to a comparative example.

FIG. 2 is a view showing impedance characteristics of the magnetic field detection sensor 1 according to the present embodiment and a magnetic field detection sensor according to a comparative example. As shown in FIG. 2, the impedance characteristic of the magnetic field detection sensor according to the comparative example is inverted V-shaped, and monotonously decreases with the zero magnetic field as the peak. However, in the comparative example, the impedance characteristic is disordered in the vicinity of the peak of the zero magnetic field.

On the contrary, the magnetic field detection sensor 1 according to the present embodiment is provided with the magnet 20, and by the magnet 20, a magnetic field is applied in the thickness direction of the magnetic thin film 12. For this reason, the unstable magnetic moment is stabilized by being restrained by the magnetic flux of the magnet 20, which makes it possible for the impedance characteristic to have a pointed peak in the vicinity of the zero magnetic field. Thereby, a predetermined inclination can be secured in the vicinity of the peak.

As described above, according to the magnetic field detection sensor 1 of the present embodiment, the magnetic impedance element 10 has the non-magnetic board 11 and the magnetic thin film 12 formed on the surface of the non-magnetic board 11, the longitudinal direction of the magnetic thin film 12 is the detection direction of the external magnetic field, and magnetic anisotropy is provided so that the magnetization easy axis of the magnetic thin film 12 is the same as the detection direction of the external magnetic field. For this reason, the magnetic impedance element 10 is made where the impedance characteristic is such as to monotonously decrease with the zero magnetic field as the peak. Here, the inventors of the present application have found that by generating a magnetic field in the thickness direction of the magnetic thin film 12 of the magnetic impedance element 10, even if the impedance characteristic is disordered in the vicinity of the peak of the zero magnetic field, this disorder can be improved. For this reason, by providing the magnet 20, an impedance characteristic with a predetermined inclination can be secured in the vicinity of the peak in a case where the magnetic impedance element 10 is provided in which the impedance characteristic is such as to monotonously decrease with the zero magnetic field as the peak,.

Moreover, since the magnetic impedance element 10 is attached to one surface of the bus bar 30 and the magnet 20 is attached to the other surface of the bus bar 30, the positional relationship therebetween is made fixed by the bus bar 30, so that a situation can be prevented that the positional relationship therebetween is broken due to vibrations or the like and this makes it impossible to generate a magnetic field in the thickness direction of the magnetic thin film 12.

While the present invention is described above based on the embodiment, the present invention is not limited to the above-described embodiment, and may be modified without departing from the gist of the invention or may be combined with another technology as appropriate within the realm of possibility.

For example, while the magnet 20 is described as the magnetic field generating means in the above-described embodiment, the present invention is not limited thereto; the magnetic field may be generated by a coil. Further, while the magnetic impedance element 10 and the magnetic field generating means such as the magnet 20 are fixedly provided with respect to the bus bar 30 in the present embodiment, the present invention is not limited thereto; a structure may be adopted in which only either one of them is fixedly provided or in which both are, for example, separated from the bus bar 30 so that neither of them is fixedly provided.

What is claimed is:

1. A magnetic field detection sensor comprising:
   a magneto-impedance element and which detects an external magnetic field from an output obtained by applying alternating current to the magneto-impedance element using a magneto-impedance effect,
      wherein the magneto-impedance element comprises a non-magnetic board and a magnetic film formed on a surface of a one side of the non-magnetic board, a longitudinal direction of the magnetic film is set as a detection direction of the external magnetic field, and magnetic anisotropy is provided such that a magnetization easy axis of the magnetic film is the same as the detection direction of the external magnetic field, and
      wherein said magnetic field detection sensor further comprises a magnetic field generating portion arranged facing another side of the non-magnetic board opposite the one side on which the magnetic film is formed and which generates a magnetic field in a thickness direction of the magnetic film and sharpens a single and only peak of an impedance characteristic in a zero magnetic field; and
   a bus bar comprising a metal plate member where current flows on a plane orthogonal to the thickness direction of the magnetic film in a current direction orthogonal to the detection direction of the external magnetic field,
      wherein the magneto-impedance element is attached to one surface of the bus bar, and
      wherein the magnetic field generating portion comprises a magnet and is attached to the other surface of the bus bar with a predetermined distance away from the magneto-impedance element in the current direction.

2. The magnetic field detection sensor according to claim 1, further comprising:
   a printed circuit board,
   wherein the magneto-impedance element is attached to one surface of the bus bar through the printed circuit board.

3. The magnetic field detection sensor according to claim 2, wherein the surface of the non-magnetic board on which the magnetic film is formed is opposite to a surface thereof where the printed circuit board is provided.

4. The magnetic field detection sensor according to claim 1, wherein the impedance characteristic with a predetermined inclination is secured in a vicinity of the peak where the impedance characteristic monotonously decreases with the peak occurring at a zero magnetic field.

5. The magnetic field detection sensor according to claim 1, wherein the magnetic field generating portion generates the magnetic field that sharpens the peak of an impedance characteristic in a zero magnetic field without shifting the peak.

6. A magnetic field detection sensor which comprises a magneto-impedance element and which detects an external magnetic field from an output obtained by applying alternating current to the magneto-impedance element using a magneto-impedance effect,
   wherein the magneto-impedance element comprises a non-magnetic board and a magnetic film formed on a surface of the non-magnetic board, a longitudinal direction of the magnetic film is set as a detection direction of the external magnetic field, and magnetic anisotropy is provided such that a magnetization easy axis of the magnetic film is the same as the detection direction of the external magnetic field,
   wherein the magnetic field detection sensor further comprises a magnetic field generating portion which generates a magnetic field in a thickness direction of the magnetic film and sharpens a peak of an impedance characteristic in a zero magnetic field,
   wherein the magnetic field detection sensor further comprises a bus bar comprising a metal plate member where current flows on a plane orthogonal to the thickness direction of the magnetic film in a current direction orthogonal to the detection direction of the external magnetic field,
   wherein the magneto-impedance element is attached to one surface of the bus bar, and
   wherein the magnetic field generating portion comprises a magnet and is attached to the other surface of the bus bar with a predetermined distance away from the magneto-impedance element in the current direction.

7. The magnetic field detection sensor according to claim 6, further comprising:
a printed circuit board,
wherein the magneto-impedance element is attached to one surface of the bus bar through the printed circuit board.

8. The magnetic field detection sensor according to claim 7, wherein the surface of the non-magnetic board on which the magnetic film is formed is opposite to a surface thereof where the printed circuit board is provided.

* * * * *